(12) United States Patent
Horn et al.

(10) Patent No.: US 8,205,558 B2
(45) Date of Patent: Jun. 26, 2012

(54) SYSTEM AND METHOD OF IMPROVING THROUGHPUT AND VEHICLE UTILIZATION OF MONORAIL FACTORY TRANSPORT SYSTEMS

(75) Inventors: George W. Horn, Brissago (CH); Adrian L. Pyke, Reading, MA (US); William T. Lebo, Quincy, MA (US)

(73) Assignee: Middlesex General Industries, Inc., Woburn, MA (US)

( * ) Notice: Subject to any disclaimer, the term of this patent is extended or adjusted under 35 U.S.C. 154(b) by 281 days.

(21) Appl. No.: 12/217,912

(22) Filed: Jul. 9, 2008

(65) Prior Publication Data

US 2009/0013897 A1  Jan. 15, 2009

Related U.S. Application Data

(60) Provisional application No. 60/958,773, filed on Jul. 9, 2007.

(51) Int. Cl.
*B61B 3/00* (2006.01)
*B65G 1/00* (2006.01)

(52) U.S. Cl. ...................... 104/91; 198/347.1

(58) Field of Classification Search .......... 104/118, 104/89, 91, 93; 198/347.1, 348
See application file for complete search history.

(56) References Cited

U.S. PATENT DOCUMENTS

| | | |
|---|---|---|
| 3,620,351 A | 11/1971 | Jerome et al. |
| 4,842,701 A | 6/1989 | Smith et al. |
| 4,911,807 A | 3/1990 | Burd |
| 4,926,753 A | 5/1990 | Weiss |
| 4,999,493 A | 3/1991 | Allen et al. |
| 5,062,368 A | 11/1991 | Sticht et al. |
| 5,078,257 A | 1/1992 | Carter, Jr. |
| 5,086,910 A | 2/1992 | Terpstra |
| 5,115,131 A | 5/1992 | Jorgenson et al. |
| 5,126,025 A | 6/1992 | Carson et al. |
| 5,143,196 A | 9/1992 | Henn et al. |
| 5,285,887 A | 2/1994 | Hall |
| 5,358,097 A | 10/1994 | Bakkila et al. |
| 5,376,252 A | 12/1994 | Ekström et al. |
| 5,577,596 A | 11/1996 | Van Essen |
| 5,636,966 A | 6/1997 | Lyon et al. |

(Continued)

FOREIGN PATENT DOCUMENTS

EP    0482454    4/1992

(Continued)

OTHER PUBLICATIONS

Cleanroom "sea of lots" concept article, undated, 2 pages.

(Continued)

*Primary Examiner* — S. Joseph Morano
*Assistant Examiner* — Zachary Kuhfuss
(74) *Attorney, Agent, or Firm* — Weingarten, Schurgin, Gagnebin & Lebovici LLP (57) ABSTRACT

Means and methods for optimizing the utilization of monorail-based vehicles carrying a work-in-progress in a clean manufacturing environment. The method includes increasing the number of pick up and drop off points on a primary or secondary monorail transportation network, to amplify the number and frequency of pick up and drop off events per vehicle per circumnavigation of the network or loop. By increasing the number of pick up and drop off events, the empty run or idle time of the corresponding vehicle will decrease, improving utilization and throughput.

16 Claims, 5 Drawing Sheets

U.S. PATENT DOCUMENTS

| | | | |
|---|---|---|---|
| 5,893,697 A | 4/1999 | Zini et al. | |
| 5,937,994 A | 8/1999 | de Barbuat | |
| 5,953,234 A | 9/1999 | Singer et al. | |
| 5,957,648 A | 9/1999 | Bachrach | |
| 6,039,316 A | 3/2000 | Jackson et al. | |
| 6,240,335 B1 | 5/2001 | Wehrung et al. | |
| 6,321,138 B1 | 11/2001 | Livesay et al. | |
| 6,324,992 B1 | 12/2001 | Morikiyo et al. | |
| 6,533,101 B2 * | 3/2003 | Bonora et al. | 198/465.1 |
| 6,540,064 B1 | 4/2003 | Bodewes et al. | |
| 6,637,342 B1 | 10/2003 | Jennings et al. | |
| 6,679,370 B2 | 1/2004 | Kasagi | |
| 6,702,099 B2 | 3/2004 | Otaguro et al. | |
| 6,814,218 B2 | 11/2004 | Nishihara | |
| 6,854,583 B1 | 2/2005 | Horn | |
| 6,878,896 B2 | 4/2005 | Esslinger et al. | |
| 2002/0064442 A1 * | 5/2002 | Ahn et al. | 414/373 |
| 2005/0038575 A1 | 2/2005 | Wu | |
| 2005/0133340 A1 | 6/2005 | Horn | |
| 2006/0104712 A1 * | 5/2006 | Bufano et al. | 404/1 |
| 2007/0163461 A1 * | 7/2007 | Shiwaku | 104/89 |
| 2007/0284217 A1 * | 12/2007 | Ito | 198/346.2 |

FOREIGN PATENT DOCUMENTS

| | | |
|---|---|---|
| EP | 0738674 | 10/1996 |
| JP | 53-34395 | 12/1993 |
| JP | 8-157016 | 6/1996 |
| JP | 11-141167 | 5/1999 |
| WO | WO 96/32205 | 10/1996 |

OTHER PUBLICATIONS

"Sea of Lots", Dresdner Transfer Brief, Issue Feb. 2000, 3 pages.

Weiss, PRI Automation Inc., "New Twists on 300 mm Fab Design and Layout", Semiconductor International, (1999), pp. 1-8.

* cited by examiner

SYSTEM AND METHOD OF IMPROVING THROUGHPUT AND VEHICLE UTILIZATION OF MONORAIL FACTORY TRANSPORT SYSTEMS

CROSS REFERENCE TO RELATED APPLICATIONS

The priority of provisional patent application 60/958,773 filed on Jul. 9, 2007 is hereby claimed.

STATEMENT REGARDING FEDERALLY SPONSORED RESEARCH OR DEVELOPMENT (Not applicable)

BACKGROUND OF THE INVENTION

1. Field of the Invention

Systems and methods for improving the throughput and the utilization of monorail vehicles bearing a work-in-progress are disclosed; and, more particularly, systems and methods for logically-transporting vehicles bearing a work-in-progress on an monorail factory system using asynchronous conveyor line segments.

2. Description of the Related Art

In semiconductor manufacturing environments, work-in-progress lots must sequence through one or more process steps that are performed by a tool specific to that process, i.e., a process tool. The sequencing of each lot to and through the required process tool is often recursive, which is to say, that a lot may return to the same process tool plural times.

In the last ten years, the semiconductor manufacturing industry has undergone significant technology change. For example, to increase productivity, the diameter of the silicon wafer was increased from 200 mm to 300 mm. As a result, due to the increased size and weight of the wafer lot carrier, a plastic enclosure called a FOUP or front opening unified pod was designed to hold wafers securely and safely and, further, to provide access to the stored wafers using robotic handling systems.

Manufacturers of semiconductors also agreed to standardize logistics hardware, choosing a technology for transporting wafer lots between process steps that is based on ceiling-mounted monorail vehicles. The decision to standardize semiconductor manufacture using monorail vehicles and a monorail transportation system, however, includes several inherent shortcomings.

For example, as one would imagine, a single, uniform technology cannot satisfy all of the requirements for modern transport needs efficiently. Consequently, by committing the industry and semiconductor manufacturers to a single, uniform transportation technology, suppliers of monorail transports have been forced to develop costly solutions within that technology, in an attempt to comply with industry demands for higher performance.

For example, modification costs incurred can be significant because factory assets, e.g., clean facilities and process equipment, are very expensive. Moreover, the adopted vehicle technology is limited in its capacity to deliver work pieces. Indeed, inherent in the design of a monorail transportation system is a limitation on vehicle utilization. For example, referring to FIG. 1, currently, each vehicle can only carry a single FOUP. Moreover, within the domain of the monorail transportation system, each vehicle, as it circumnavigates the circuit of the vehicle loop 1, can only be scheduled for sequential pick up 2 and delivery or drop off 4 of the FOUP. Between the pick up point 2 and the drop off point 4, the vehicle experiences a useful run 3. However, after delivery 4 and before the next pick up 2, the vehicle is unused.

Figure 1:
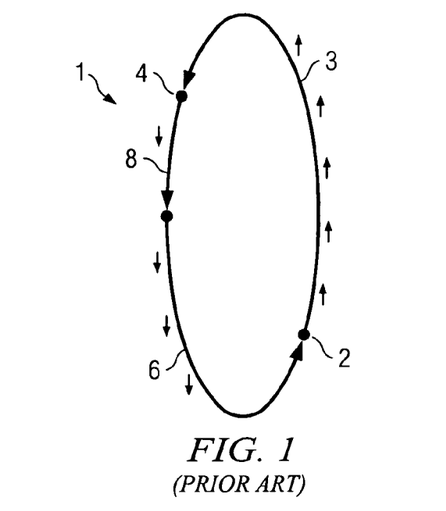
FIG. 1 shows an illustrative diagram of a monorail transportation loop in accordance with the prior art.

As a result, in this two-step, linear or quasi-linear process, vehicles will sometimes run empty 6, e.g., after drop off 4 and before the next pick up 2, and/or vehicles will sometimes be idle 8, corresponding to the time the vehicle waits before its next pick up assignment after drop off 4. Whenever a vehicle is idle or empty, the over-all utilization rate of the system is reduced, which affects the system's capacity to deliver. The adverse effect of such limitations cascades down to the utilization of the semiconductor process equipment, e.g., the process tools, as well as to the time, or, more specifically, the cycle time, it takes for the semiconductor product to transit through all factory processes to finish.

To address these shortcomings using the standardized monorail technology requires finding a proper balance between providing more vehicles and increasing the vehicular speed. These solutions, however, are expensive and also have practical limits. Chief of which is that vehicle numbers or quantity and vehicle speed are inversely related.

For example, at some point, the law of diminishing returns limits the number of vehicles that can be added to the transportation system. The number of vehicles that can be added depends on the available length of the transportation system, the speed of transit of each vehicle, and the requirement for collision-free, stop-and-go operation. When a greater number of vehicles are employed on a common track, the distance between vehicles decreases. As a result, the vehicle speed must be lowered to ensure that the resulting distance between vehicles provides adequate room for deceleration to ensure collision-free, stop-and-go operation. In short, higher speeds require longer stopping distances because of practical deceleration limits. If the necessary stopping distances are longer, then fewer vehicles can operate on the transportation system.

Therefore, it would be desirable to maximize the efficiency of discrete vehicles operating on a standardized monorail transportation system by integrating peripheral conveyor line segments into the standardized monorail transportation system. Advantageously, by integrating peripheral conveyor line segments into the existing transportation technology, the performance of the existing system can be improved and vehicle utilization and throughput can be increased. More specifically, the conveyor line segments provide dynamic, asynchronous vehicle transfer and buffering points that can be used to maximize vehicle utilization and throughput.

SUMMARY OF THE INVENTION

Means and methods for improving the performance of an existing monorail transportation system that includes monorail vehicles bearing a work-in-progress in a clean manufacturing environment are disclosed. The means and methods include providing plural dynamic, asynchronous transfer points on a standard monorail transportation system and controlling logic, to optimize the efficiency and use of the vehicles and of the entire transportation system. More particularly, the means and methods include providing dynamic, asynchronous transfer points to provide communication between a main monorail transportation loop and remote monorail transportation bay loops.

BRIEF DESCRIPTION OF THE SEVERAL VIEWS OF THE DRAWINGS

The invention will be more fully understood by referring to the Detailed Description of the Invention in conjunction with the Drawings, of which.

DETAILED DESCRIPTION OF THE INVENTION

At the onset, the analysis of transport requirements in a clean semiconductor environment shows a spatially and sequentially chaotic distribution of work-in-progress lot destinations. Furthermore, the processing is necessarily recursive. Consequently, at the factory level, to optimize efficiency, manufacture should not be arranged as a linear, sequential production line.

Be that as it may, a standardized monorail transportation system is a linear or quasi-linear, sequential production line, which is inherently inefficient. Monorail-based vehicles carrying work piece carriers, e.g., FOUPs, transit the circuit of the monorail transportation network, performing one of two operations: dropping off work piece carriers for processing or picking up work piece carriers after processing. Thus, means and methods for optimizing efficiency and the utilization of the vehicles that transport work piece carriers along the circuit of the monorail transportation network in a clean manufacturing environment are desirable.

Figure 2:
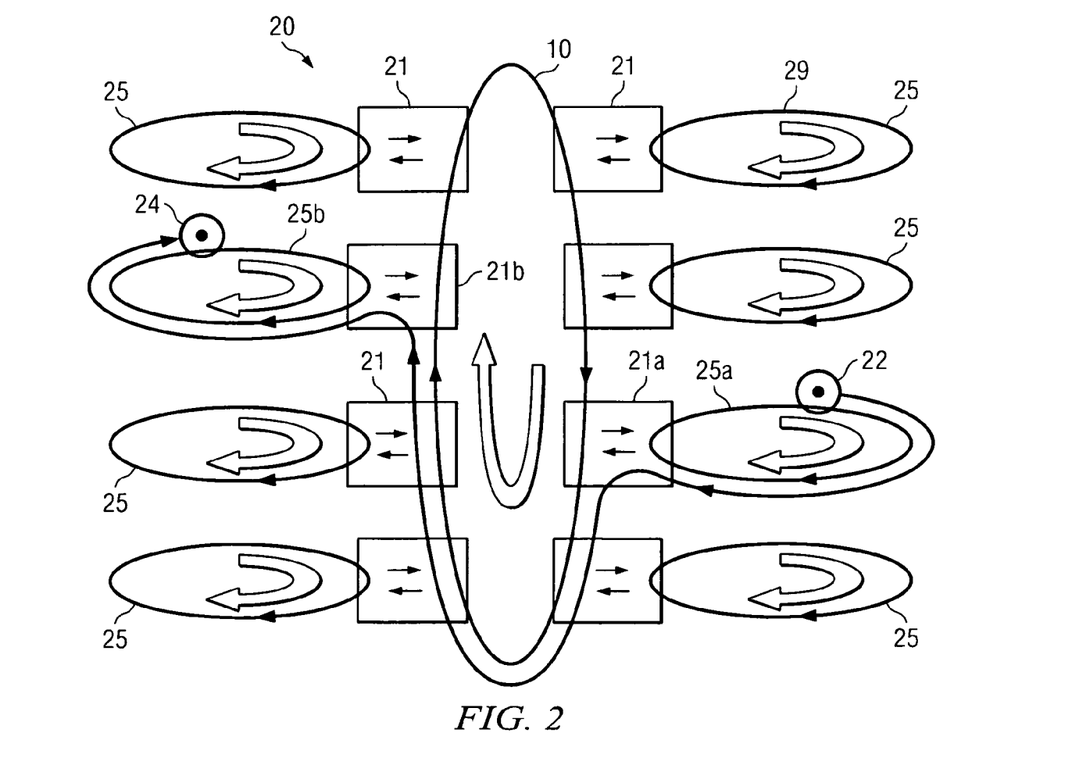
FIG. 2 shows an illustrative diagram of a monorail transportation loop having inter-bay and intra-bay lines in accordance with the prior art.

Referring to FIG. 2, a clean manufacturing environment 20 is shown. The environment 20 includes a primary monorail transportation network or main inter-bay loop 10 in combination with a plurality of bays 29. Each of the bays 29 includes at least one and, preferably, plural process tools disposed along a closed, intra-bay, monorail-based loop 25. Large stockers connect the inter-bay loop 10 to the intra-bay loops 25.

In operation, in order to transport a work-in-progress from a first location 22 on a first intra-bay loop 25a to a second location 24 on a second intra-bay loop 25b, the work piece carrier is sequentially transported from the first intra-bay loop 25a to a first stocker 21a, whence the work piece carrier is transported along the inter-bay loop 10 to a second stocker 21b. At the second stocker 21b, the work piece carrier is transported along the second intra-bay loop 25b to the second location 24.

As previously mentioned, the linearity of monorail-based transportation holds captive each discrete vehicle. Indeed, each vehicle on the inter-bay loop 10 or on the intra-bay loops 25 either carries a lot or runs empty. Vehicle utilization, therefore, depends on what portion of the total time needed to circumnavigate the main inter-bay loop 10 or the intra-bay loop 25 is dedicated to transporting lots from point to point and on what portion of the total time is unused, i.e., idle or running empty.

In the abstract, improved vehicle efficiency and optimized throughput are achievable by allocating a greater number of source (pick up) and destination (drop off) points along each inter-bay loop 10 and intra-bay loop 25, to increase the functional granularity of the same. By providing multiple additional pick up and drop off points on the inter-bay loop 10 and intra-bay loops 25, the capacity of each vehicle to perform multiple pick up and drop off operations during a single circumnavigation of the loop 10 or 25 increases. Vehicle utilization is enhanced by optimizing the amount of time a corresponding vehicle is used carrying and delivering a work piece carrier versus the amount of unused time.

Some of the exemplary means by which this can be accomplished includes providing asynchronous conveyor line segments in connection with at least one and preferably plural intra-bay loops 25 (FIG. 7, and FIG. 8); providing at least one conveyor shunt across an inter-bay loop 10 or intra-bay loop 25 (FIG. 4); providing at least one parallel conveyor line segment along a portion or portions of the inter-bay loop 10 or the intra-bay loop 25 (FIG. 5 and FIG. 6); and/or providing plural multi-point interface connection points between intra-bay loops 25 and process equipment (process tools), storage devices (stockers), and the like. These means are discussed in greater detail below. Those of ordinary skill in the art can appreciate that these examples are merely possible applications of the methodology of improving the vehicle utilization and throughput of a monorail transportation network that is taught herein.

Before the particular, exemplary applications of the invention are described, however, the conveyor system will be discussed briefly.

Asynchronous Conveyor System

The present system 20 requires a controller and dynamic, self-propelled, software- or hardware-controlled pathways to buffer and/or transport work piece carriers, e.g., FOUPs, within the domain of the system 20, to minimize the monorail-based vehicles' idle or empty time and, conversely, to optimize the vehicles' utilization rate. By providing multiple transfer points that are structured and arranged to promote more frequent and logical exchange of work piece carriers, the transport capacity of each monorail-based vehicle is improved, which increases utilization and efficiency of the vehicles. One such pathway is an asynchronous, soft conveyor system.

U.S. Pat. No. 6,047,812 entitled "Asynchronous Soft Conveyor System" (hereinafter the "'812 Patent") and assigned to Middlesex General Industries, Inc. of Woburn, Mass. (MGII) discloses a logically-controlled, conveyor system for transporting items or objects, e.g., work pieces, works-in-progress, work piece carriers, lots, and the like, along a path that is divided into discrete sections. Advantageously, the conveyor transportation system provides "soft buffering" for collision-free transportation.

More specifically, the '812 Patent, which is incorporated in its entirety herein by reference, discloses asynchronous, soft conveying that provides a process and system for transporting items or objects independently and for starting and stopping the items in a smooth fashion, to prevent the items from bumping into or colliding with each other. The patented MGII conveyor system includes transiting means for moving items or objects along the conveyor path and means for sensing when or whether an item or object is located on any conveyor section.

Each conveyor section includes a plurality of conveyor segments, at least one sensor, at least one drive element, and at least one conveyor section controller. The conveyor sections and segments are structured and arranged to provide soft buffering and to provide sensed data to a central controller. The drive element can be a magnetic hysteresis drive that is embedded in each conveyor section. The conveyor section controller, such as an embedded conveyor printed circuit board (PCB), controls the operating state of the drive elements, e.g., forward, reverse, idle, and stop, based on sensed positional, tool availability, and other data.

The conveyor system according to the teachings of the '812 Patent is divided into multiple conveyor sections having sensors located on each section. The drive for each conveyor section and the sensors for each section of the conveyor are operated so that only one item occupies a discrete conveyor section at any given time. As a result, when a first item occupies one conveyor section, the drive for the conveyor section is stopped or idled if a second item occupies the next or ensuing conveyor section.

The conveyor elements, or accumulation of conveyor elements, with the above characteristics, when used in conjunction with a monorail transportation system(s), comprise dynamic, self propelled, hardware- and/or software-controlled pathways to direct work piece carriers for the convenience of transport vehicles, in such a way as to minimize the latter's need to transit between destinations while carrying no load. The effect being to increase the vehicle systems transport capacity.

Shunt Methodology

Figure 4:
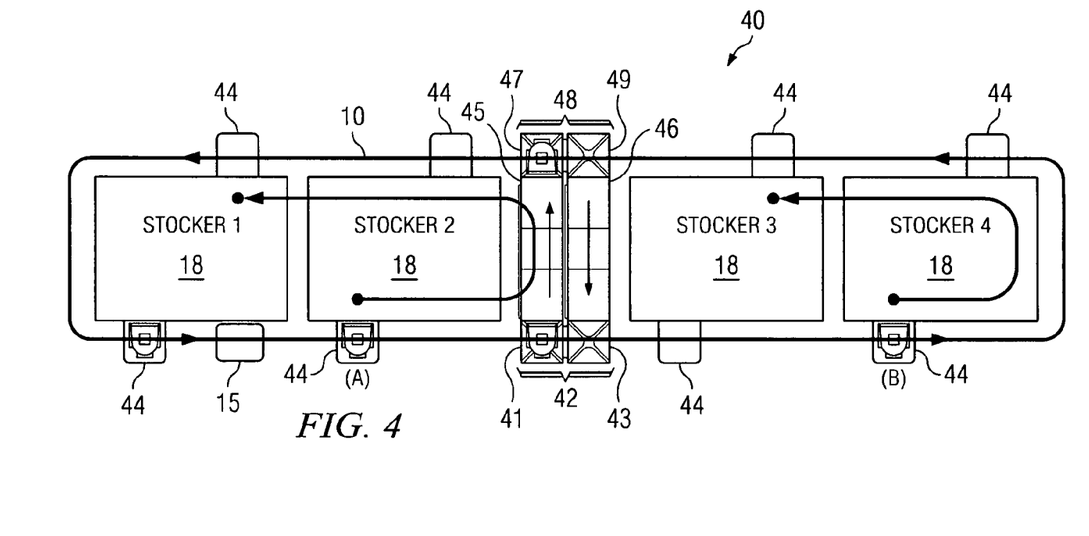
FIG. 4 shows an inter-bay shunt in accordance with the present invention.

Referring to FIG. 4, an inter-bay shunt 40 is shown integrated into a main inter-bay loop 10. Advantageously, an inter-bay shunt 40 can be incorporated into an existing monorail transportation system for the purposes of increased efficiency of the carrier vehicles. More specifically, the inter-bay shunt 40 provides additional exchange points at which work piece carriers can be dropped off or picked up, to optimize the utilization of each vehicle 15 on the inter-bay loop 10.

Thus, the inter-bay shunt 40 is designed to increase the utilization of inter-bay vehicles 15 by providing redundant dynamic exchange points 42 and 48. The inter-bay shunt 40 is structured and arranged to connect one part or side of the inter-bay loop 10 to another part or side of the inter-bay loop 10, further providing a conveyor line segment between each part or side of the inter-bay loop 10. By providing drop off and pick up points and a short cut, the shunt 40 enables a single vehicle 15 to perform plural load carrying tasks during a single circumnavigation or transit of the inter-bay loop 10. Although use of a shunt 40 is described in connection with the main inter-bay loop 10, those of ordinary skill in the art can appreciate that a shunt 40 could also be included on the intra-bay loop 25 of each bay 29.

Each shunt 40 includes a pair of dynamic exchange points 42 and 48. Dynamic exchange point 42 includes a first load point 41 and a second load point 43. Dynamic exchange point 48 includes a first load point 47 and a second load point 49. When a vehicle 15 is picking up a work piece carrier, the affected load point is referred to as a source point. When a vehicle 15 is dropping off a work piece carrier, the affected load point is referred to as a destination point.

For convenience and discussion purposes only, we will assume that the dynamic exchange points 42 and 48 are adapted to transport work pieces therebetween uni-directionally according to the arrows shown in FIG. 4. Preferably, drop off (destination) points 41 and 49 are disposed upstream of the pick up (source) points 43 and 47, respectively, so that a vehicle 15 dropping off a work piece carrier at a destination point 41 or 49 can immediately pick up an available work piece carrier at the nearest downstream source point 43 and 47.

Those of ordinary skill in the art can appreciate that the dynamic exchange points 42 and 48 could also be bi-directional. Moreover, dynamic exchange points 42 and 48 do not have to be located adjacent or proximate to each other, but, rather, can be disposed at regular or irregular intervals along the parts or sides of the inter-bay loop 10. However, by locating dynamic exchange points 42 and 48 adjacent or proximate to each other, idle and empty run times can be further minimized if there is a pick up event immediately downstream of a drop off event.

An example of the operation of an inter-bay shunt 40 follows. As shown in FIG. 4, if the pending tasks are to transport work piece carrier A from Stocker 2 to Stocker 1 and to transport work piece carrier B from Stocker 4 to Stocker 3, the inter-bay shunt 40 can be used so that a single vehicle 15 performs both transports during a single circumnavigation of the inter-bay loop 10. Otherwise, but for the shunt 40, a first vehicle 15 would be controlled to pick up work piece carrier A and deposit it at Stocker 1 and a second vehicle would be controlled to pick up work piece carrier B and deposit it at Stocker 3.

More particularly, the vehicle controller can direct the nearest available empty vehicle 15 to pick up work piece carrier A at the I/O port 44 of Stocker 2 and to transport it to destination point 41 of exchange point 42, where work piece carrier A can be deposited onto the conveyor shunt 40. The vehicle controller can then direct the dynamic exchange point 42 to transport work piece carrier A across the inter-bay loop 10 to source point 47 of dynamic exchange point 48 and, more particularly, from destination point 41 to source point 47 via conveyor line segment 45.

In order to correct the orientation of work piece carrier A, at least one of the source point 47 and the destination point 41 must be structured and arranged to rotate the work piece carrier 180 degrees or each must be structured and arranged to rotate the work piece carrier 90 degrees. For this purpose, the destination point 41 can include lift and transfer sections for transferring work piece carriers onto the conveyor line segment 45 and the source point 47 can include lift and transfer sections for transferring work piece carriers from the conveyor line segment 45 onto the source point 47.

After the vehicle 15 successfully deposits work piece carrier A at the destination point 41, the vehicle 15 continues in an unused state until it picks-up work piece carrier B at the I/O port 44 of Stocker 4. Those of ordinary skill in the art can appreciate that had there been a work piece carrier at the source point 43 downstream of the destination point 41 at exchange point 42, the vehicle 15 could have been directed to pick up that work piece carrier, further reducing the duration of its unused state.

Vehicle 15 can then be directed to transport work piece carrier B to the I/O port 44 of Stocker 3, where work piece carrier B can be deposited. After the vehicle 15 successfully deposits work piece carrier B at the Stocker 3 I/O port 44, the vehicle 15 travels in an unused state until it picks up work piece carrier A at the source point 47. Finally, the vehicle 15 can transport work piece carrier A to the I/O port 44 of Stocker 1, where work piece carrier A is deposited, completing the pending tasks. Here again, those of ordinary skill in the art can appreciate that another vehicle 15 could have picked up work piece carrier A at the source point 47 without having to wait for the same vehicle 15 that dropped it off to pick it up again.

For the example, when a single vehicle 15 is used to perform two separate events, i.e., the transportation of work piece carrier A and work piece carrier B, the unused time includes the short gaps between the exchange point 42 and the Stocker 4 I/O port 44 and between the Stocker 3 I/O port 44 and the exchange point 48. In contrast, were the two events performed by two separate and distinct vehicles 15, the unused time would include the gaps between the I/O port 44 of Stocker 2 and the I/O port 44 of Stocker 4 and between the I/O port 44 of Stocker 3 and the I/O port 44 of Stocker 1. Moreover, two circumnavigations are required versus a single circumnavigation. In short, by providing the shunt 40, the system 20 can free up an entire vehicle 15 for an unrelated operation and, moreover, convert otherwise unused time corresponding to short transit legs between the I/O port 44 of Stocker A and exchange point 42 and between exchange point 48 and I/O port 44 of Stocker 1 to usable time.

As a result, by providing multiple, interconnected exchange points 42 and 48 on the inter-bay loop 10, vehicle utilization, vehicle availability, and system throughput are improved without adding additional vehicles. Indeed, the number of vehicles required for the described operation decreased by half and was still more efficiently used.

Parallel Conveyor Line Segment Methodology

Figure 5:
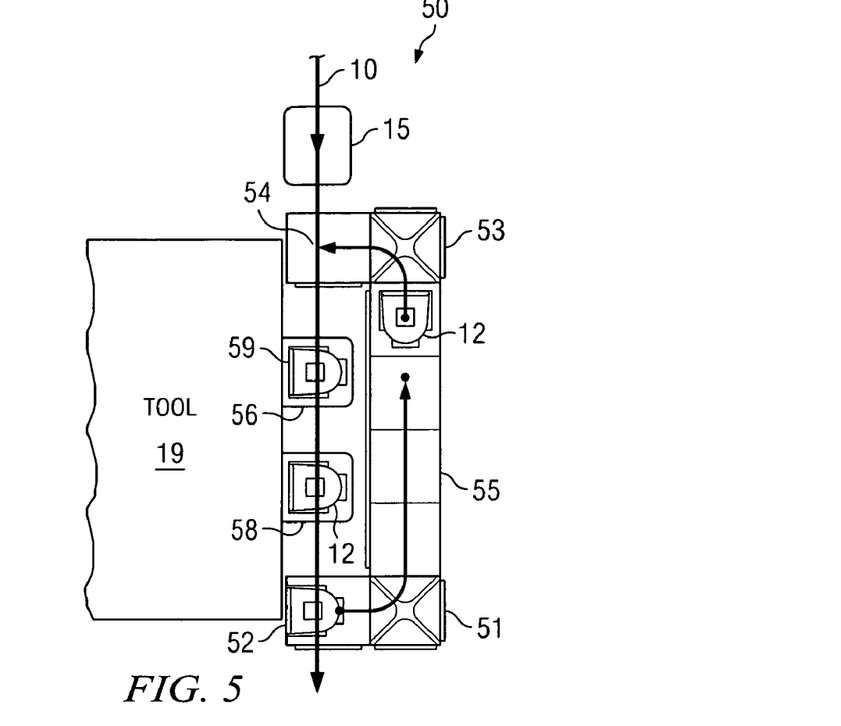
FIG. 5 shows a dynamic tool buffer in accordance with the present invention.
Figure 6:
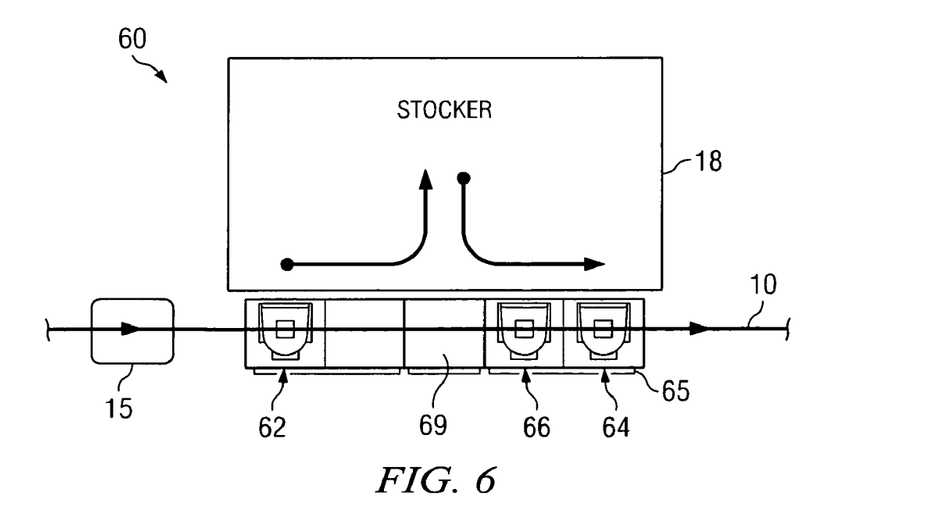
FIG. 6 shows a dynamic stocker port in accordance with the present invention.

Conveyor line segments can also be structured and arranged advantageously along, i.e., in parallel or substantially in parallel to, the inter-bay loop 10 as shown in FIG. 5 and FIG. 6. These parallel conveyor line segments allow temporary queuing and reordering of work piece carriers, which provides for more efficient use of a single vehicle 15 transit of the inter-bay loop 10. Those of ordinary skill in the art can appreciate that parallel line segments can also be include along the intra-bay loops 25 of each bay 29, e.g., proximate to each process tool 19.

For example, FIG. 5 illustrates parallel conveyor line segments that are structured and arranged to provide a dynamic tool buffer 50. A dynamic tool buffer 50 can be integrated adjacent to or proximate a process tool 19.

The dynamic tool buffer 50 includes a deposit point 52 and a pick up point 54 that are interconnected by a segmented conveyor buffer line 55. Preferably, the deposit point 52 is located on the inter-bay loop 10 downstream of the I/O ports 56 and 58 providing access to and egress from the process tool 19 and the pick up point 54.

The dynamic tool buffer 50 is adapted to reverse the direction of movement of the work piece carrier 12 without affecting the global orientation of the work piece carrier 12. Accordingly, the dynamic tool buffer 50 can include a first lift and transfer device, to move the work piece carrier from the deposit point 52 onto the conveyor buffer line 55, a first 90-degree turn device 51, which is adapted to change the direction of travel of the work piece carrier 12 on the conveyor buffer line 55 by 90 degrees, a second 90-degree turn device 53, which is adapted to change the direction of travel of the work piece carrier 12 another 90 degrees, and a second lift and transfer device, to move the work piece carrier 12 from conveyor buffer line 55 onto the pick up point 54.

The 90-degree turn devices 51 and 53 can also be adapted to change the direction of movement of the work piece carrier 12 without changing the orientation of the work piece carrier 12 with respect to the main inter-bay loop 10. Alternatively, as shown in FIG. 5, each time that the direction of movement of a work piece carrier 12 is changed 90 degrees, the orientation of the work piece carrier 12 can also be changed. The only requirement for this alternate approach is that the orientation of the work piece carrier 12 at the deposit point 52, at the I/O ports 56 and 58, and at the pick up point 54 is the same.

Operation of the dynamic tool buffer 50 will now be described to illustrate the effect of providing a greater number of pick up points and destination points on the main inter-bay loop 10 and of increasing the number of subsequent pick up and drop off events occurring within a single circuit of a single vehicle 15 on the inter-bay loop 10. The effect of which is to reduce the empty run time and/or idle time between a first pick up and drop off event and subsequent pick up and drop off events and to improve the utilization of the corresponding vehicle 15.

When a vehicle 15 carrying a work piece carrier 12 that is next scheduled for processing at a specific process tool 19 whose access I/O port(s) 56 and/or 58 is occupied or otherwise not available, the vehicle controller can, instead, direct the corresponding vehicle 15 to deposit the work piece carrier 12 at a tool buffer deposit point 52, which can be disposed immediately downstream of the I/O ports 56 and 58. The controller can then direct the dynamic tool buffer 50 to transport the deposited work piece carrier 12 onto the conveyor buffer line 55, where the work piece carrier 12 can remain in a queue until the appropriate access I/O port 56 or 58 to the process tool 19 becomes available.

Once the access I/O port 56 or 58 becomes available, the controller can direct the dynamic tool buffer 50 to transport the work piece carrier 12 to the pick up point 54 where the next available vehicle 15 can be directed to pick up the work piece carrier 12; transport the work piece carrier 12 to the access I/O port 56 or 58; and deposit the work piece carrier 12 at the same.

If a priority work piece requires expedited access to a particular process tool 19, the vehicle controller can also direct the next available empty vehicle 15 on the inter-bay loop 10 to pick up the work piece carrier 59 that is currently next in line at the access I/O port 56. The bumped work piece carrier 59 can be deposited at the deposit point 52, where it enters or initiates a queue on the conveyor buffer line 55. The vehicle controller can then direct the vehicle 15 transporting the priority work piece carrier 12 to deposit the priority work piece at the access I/O port 56.

If desired, the bumped work piece carrier 59 can be moved to the front or beginning of the queue on the conveyor buffer line 55 by directing empty vehicles 15 to sequentially pick up and drop off all of the work pieces carriers 12 that are ahead of the bumped work piece carrier 59 at the pick up point 54 and the deposit point 52, respectively. This will re-establish the processing order of the work piece carriers 12 that existed before the priority work piece carrier was introduced into the queue.

By buffering work piece carriers 12 during periods when access I/O ports 56 and/or 58 to a particular process tool 19 are occupied or otherwise not available, vehicles 15 that conventionally might otherwise have had to wait for the I/O port 56 and/or 58 to become available are freed of their work piece carriers 12 and can proceed to another task, which increases vehicle 15 availability utilization without having to increase the number of vehicles 15 on the inter-bay loop 10. Again, those of ordinary skill in the art can appreciate that parallel tool buffers 50 can also be similarly structured and arranged at or near process tools 19 that are disposed on the intra-bay loops 25 rather than on the main inter-bay loop 10.

FIG. 6 shows another application of parallel conveyor line segments to provide a dynamic stocker port 60. Stockers 18 are used to store work piece carriers temporarily for future disposition or use. A conventional stocker 18 includes a single SEMI standard I/O port 69 that is disposed on the outside of the stocker 18 and through which all items stored in the stocker 18 enter and exit. Typically, a single vehicle 15 can either drop off a work piece carrier at the I/O port 69 or it can pick up a work piece carrier at the I/O port 69.

As shown in FIG. 6, however, by integrating a parallel conveyor line segment 65 with the I/O port 69, the resulting dynamic stocker port 60 enables a single vehicle 15 to perform a deposit operation and a pick up operation with minimal unused time. The effect of which is to reduce the empty run time and/or idle time between a drop off event and a subsequent pick up by the same vehicle 15, which improves the utilization of the corresponding vehicle 15.

For example, the vehicle controller can direct a vehicle 15 to deposit a first work piece carrier to be stored at a deposit point 62 that is located upstream of the I/O port 69 to the stocker 18. Subsequently, downstream of the same I/O port 69, the same vehicle 15 can pick up a second work piece carrier at a pick up point 64. The conveyor line segment 65 also can provide a buffering queue 66 immediately downstream of the deposit point 62 end and/or immediately upstream of the pick up point 64 end.

The dynamic stocker port 60 is structured and arranged to reduce vehicle wait times at stocker exchangers. Although not readily apparent from FIG. 6, the I/O port 69 and the dynamic stocker port 60 are disposed at an elevation below that of the main inter-bay loop 10.

Integration with Non-Standard Systems Methodology

Figure 7:
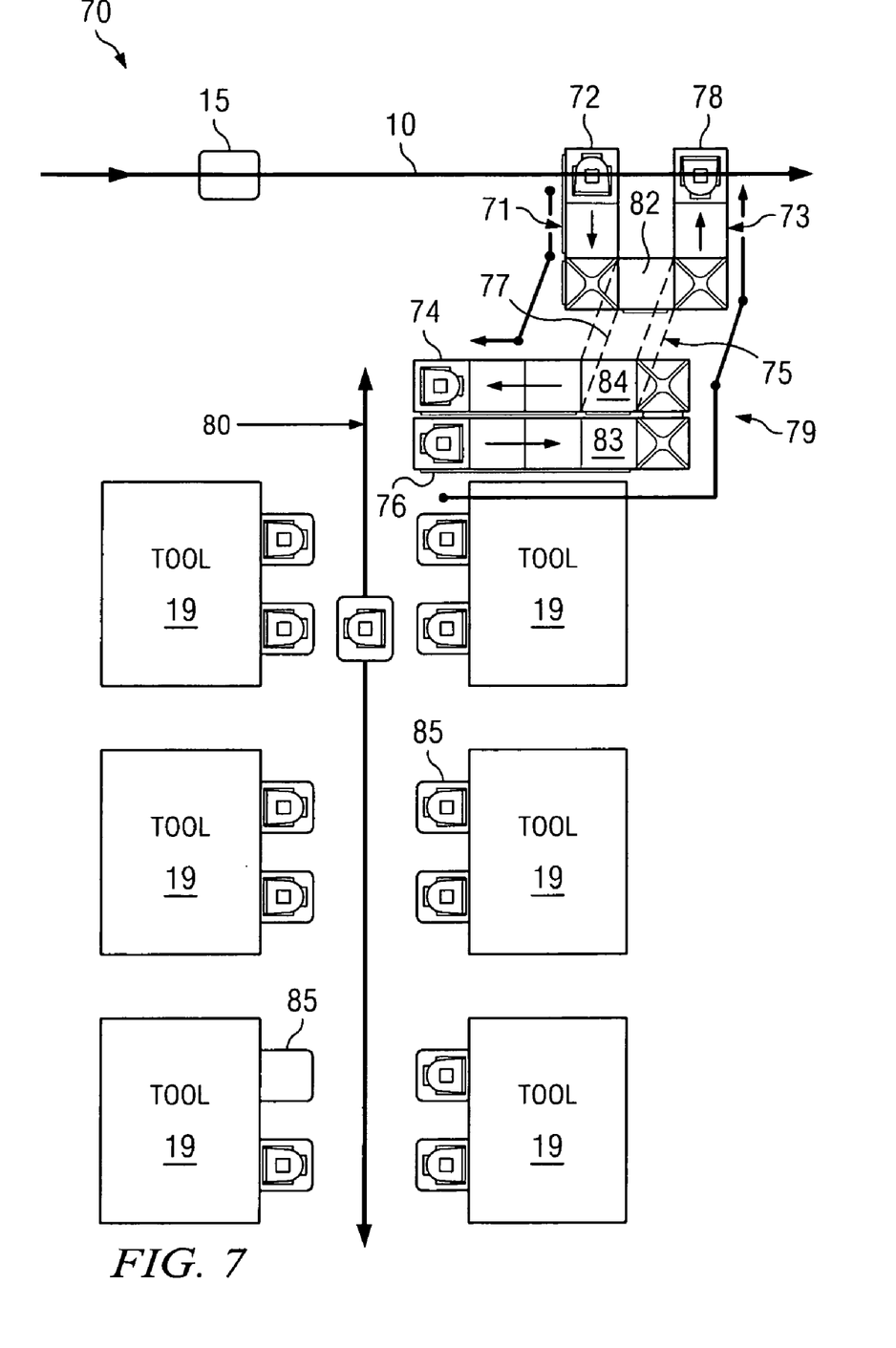
FIG. 7 shows a conveyor line bridge for connecting a monorail transportation system to an automated or rail-guided vehicle system in accordance with the present invention.

Optionally, the integrated monorail transportation system 10 can includes bays 29 that include intra-bay loops 25 that are other than closed, monorail transportation loops, e.g., an Automated or Rail-Guided Vehicle (AGV/RGV) system that is well known to the art. A system 70 having an AGV/RGV system 80 is shown in FIG. 7.

The system 70 includes the main inter-bay loop 10 and a bay 29 having an AGV/RGV system 80. The AGV/RGV system 80 in the bay 29 is shown having plural process tools 19 that each include I/O ports 85 at which the AGV/RGV system 80 deposits and picks up work piece carriers for processing or for transportation.

An inter-connecting conveyor linking system 75 is structured and arranged to transport work piece carriers between the monorail transportation system 10 and the AGV/RGV system 80. Those of ordinary skill in the art can appreciate that, although the following discussion will be directed to an AGV/RGV system 80, its teaching can be applied to any non-standard or non-traditional bay transit system.

Necessarily, the conveyor linking system 75 includes an upper conveyor line system 73 and a lower conveyor line system 79. The upper conveyor line system 73 is in operational communication with the monorail transportation system 10 and the lower conveyor line system 79 is in operational communication with the AGV/RGV system 80. A vertical transportation means 77, e.g., a conveyor elevator and the like, links the upper and lower conveyor lines systems 73 and 79.

The upper conveyor line system 73 includes a drop off interface 72 and a pick up interface 78, by which work piece carriers are either deposited or picked up by vehicles 15 circulating on the monorail transportation system 10. Preferably, the drop off point 72 is disposed upstream of the pick up point 78 to shorten unused time of a common vehicle 15 between a drop off and a pick up event.

A U-shaped conveyor line segment 71 connects the drop off interface 72 and the pick up interface 78. The direction of travel of the conveyor segments is shown by the arrows in FIG. 7. At some point between the drop off interface 72 and the pick up interface 78 there is an interface for vertical transit 82 that is capable of moving work piece carriers horizontally along the conveyor line 71 or vertically by way of the vertical transportation means 77.

A similar vertical transit interface 84 is disposed at some point between a drop off interface 76 and a pick up interface 74 of the lower conveyor line system 79 and is similarly adapted to move work piece carriers vertically by way of the vertical transportation means 77 or horizontally along the lower conveyor line 83. In addition to the drop off interface 76 and a pick up interface 74, by which work piece carriers are either deposited on or picked up by the AGV/RGV system 80, the lower conveyor line system 79 also includes a conveyor line 83 that connects the drop off interface 76 and a pick up interface 74. The direction of travel of the conveyor line segments is shown by the arrows in FIG. 7.

The effect of providing a drop off interface 72 and a pick up interface 78 on the inter0bay loop 10 is to reduce the empty run time and/or idle time between a pick up and a drop off event; to free-up vehicles 15; and to improve the utilization of the corresponding vehicle 15.

Inter-to-Intra-Bay Loop Interconnection Methodology

Figure 8:
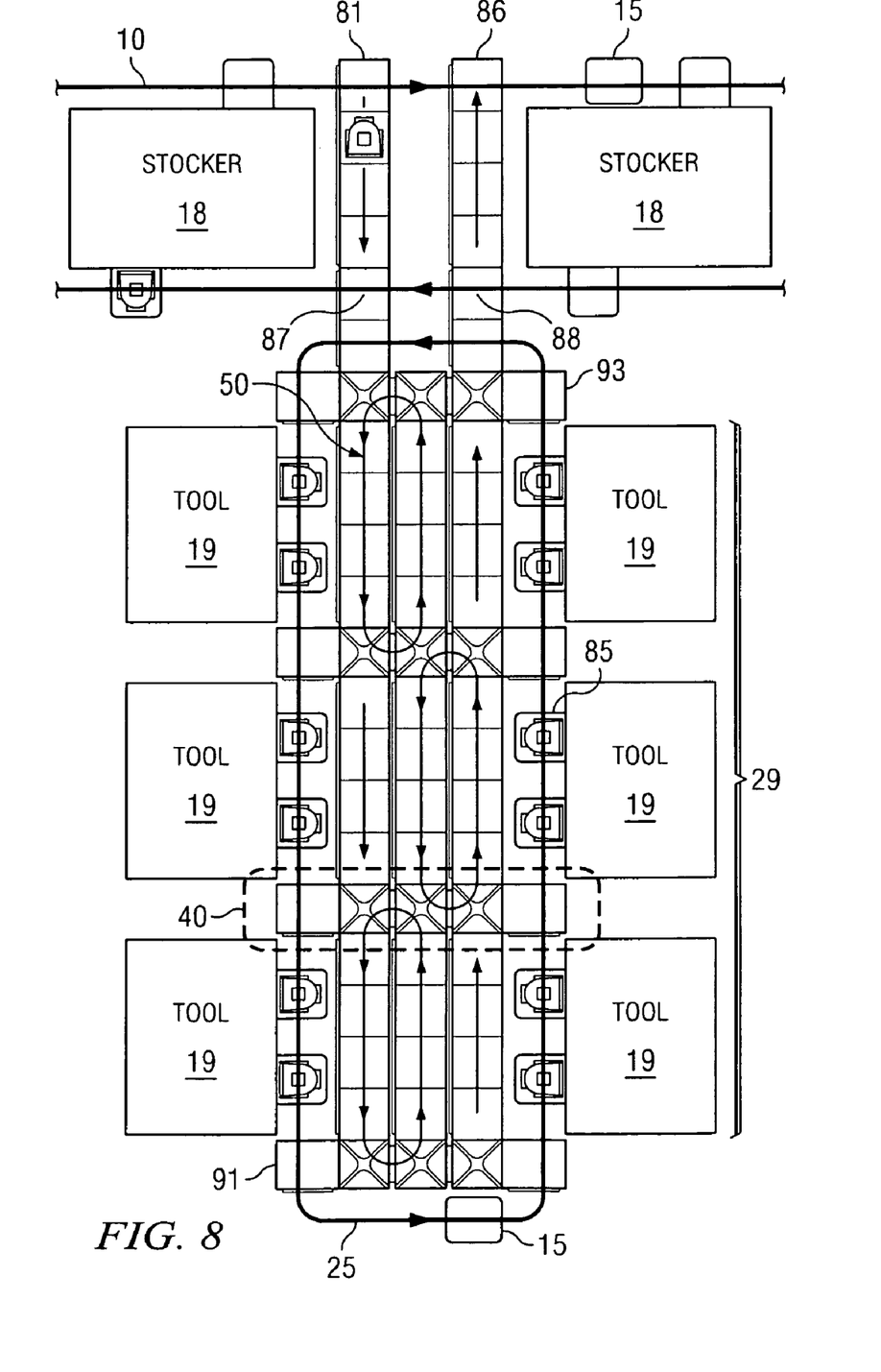
FIG. 8 shows an intra-bay conveyor loop for connecting plural monorail transportation systems in accordance with the present invention.

Referring to FIG. 8, for improved vehicle utilization and system efficiency, factory systems 20 are structured and arranged to include plural bays 29. Each bay 29 further can includes a closed, intra-bay monorail loop 25 and at least one process tool 19. The vehicles 15 of the intra-bay loop 25 pick up and drop off work piece carriers at the I/O ports 44 of the various process tools 19 in accordance with standard operating procedures.

For the purpose of interconnecting the main inter-bay loop 10 domain and the intra-bay loop 25 domains, a conveyor line segment 98 with plural exchange points can be integrated into the system 20. For example, the intra-bay conveyor line segment 98 in FIG. 8 includes exchange points 81 and 86 at which vehicles 15 operating on the main inter-bay loop 10 can either deposit work piece carriers 12 and/or pick up work piece carriers 12. Optionally, although not shown in FIG. 8, exchange points for depositing work piece carriers 12 and for picking up work piece carriers 12—similar to drop off exchange point 81 and pick up exchange point 86—could also be provided on the other side of the inter-bay loop 10.

The exchange points 81 and 86 can include at least one lift and transfer junction. Lift and transfer junctions include fixed drive portions and lifting devices. The fixed drive portions provide impetus to propel work piece carriers 12 in the direction of flow on the conveyor line segments 87 and 88.

Lifting devices lift the work piece carrier vertically sufficiently so that the bottom surface of the carrier is above the influence of the fixed drive portion. The lifting device can either buffer the work piece carrier by lifting it and holding it in this state for a period of time or can alter the direction of flow or travel of the work piece carrier.

A uni-directional first conveyor line segment 87 transports work piece carriers 12 that are deposited at the drop off exchange point 81 to a pick up exchange point 91 on the conveyor loop 95 of the bay 29. A uni-directional second conveyor line segment 88 transports work piece carriers from a drop off exchange point 93 on the conveyor loop 95 of the bay 29 to the pick up exchange point 86 of the main inter-bay loop 10. Arrows on the first and second conveyor line segments 87 and 88 show the direction of travel of each.

The plural conveyor segments of the conveyor line segments are adapted for autonomous, collision-free carrier conveyance and queuing. The conveyor segments can include straight segments, turn segments, elevator segments, rotating segments, intersecting node segments, and/or lift and transfer segments. Accordingly, conveyor section operation can be structured and arranged to include linear drive, lift and transfer, 90-degree rotation, 180-degree rotation, vertical raising, and vertical lowering.

Pick up and drop off exchange points 91 and 93 at which work piece carriers 12 can be picked up or dropped off by vehicles 15 operating on the intra-bay loop 25 are provide at one or more locations on the conveyor loop 95 of the bay 29.

The conveyor loop 95 can further include conveyor line segment features such as shunts 40 and dynamic tool buffers 50, which are described in greater detail below.

Controller

Having added a plurality of exchange points and peripheral conveyor line segments, the control system for the monorail transportation system 10 must be adapted to control the new functions that are made possible by the plural exchange points and conveyor line segments or a separate controller 30 can be coupled to the existing controller to do the same.

For large-scale manufacturing operations, a multiplicity of work piece carriers flow concurrently and asynchronously on the system 20 to a multitude of different destinations, e.g., intra-bay loops 25, inter-bay loops 10, process tools 19, dynamic buffers 50, input ports, output ports, and the like. Without adequate control measures, such flow would be nothing short of chaotic. However, there is statistical efficiency to this arrangement.

Figure 3:
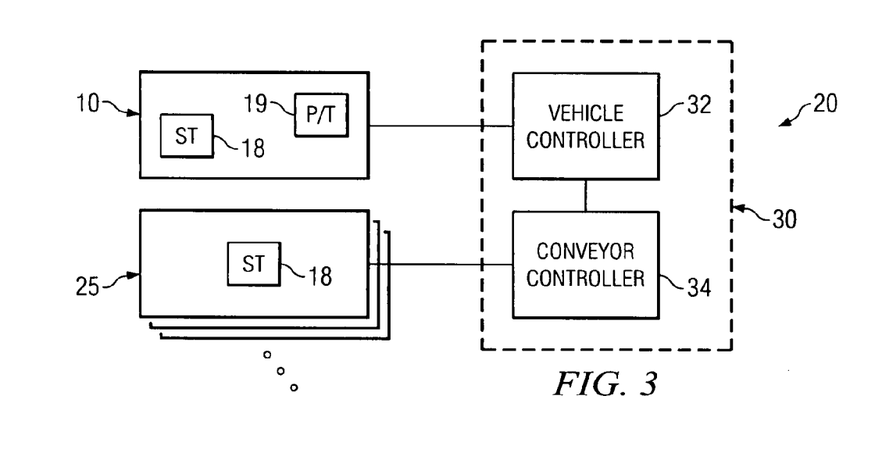
FIG. 3 shows a block diagram of an integrated transportation system in accordance with the present invention.

Referring to FIG. 3, the system 20 includes a controller 30 that is adapted or further adapted to coordinate and control the transit of vehicles 15 on the main inter-bay loop 10, on the intra-bay loops 25, and on conveyor line segments as well to coordinate and control the exchange of work pieces carriers between vehicles 15 and exchange points. Such coordination and control includes, without limitation, the allocation of vehicles 15 and conveyor line segments to control the timing of pick up and drop off operations, of shunting operations, of queuing operations, of buffering operations, of re-ordering operations, of tool processing, and so forth.

The system controller 30 can include intelligent hardware and/or software that are structured and arranged to control movement and timing of the vehicles 15, the process tools 18, and the peripherals from the main inter-bay loop 10 logically, to maximize the use and efficiency of the vehicles 15 on the main inter-bay loop 10. The system controller 30 can be a single controller or plural sub-system controllers 32 and 34 that are each adapted to control a single sub-system, e.g., the vehicles 15 on the inter-bay loop 10 and/or intra-bay loop 25, the exchange points, the conveyor line segments, and the like.

Exchange protocols between the main inter-bay loop 10 and peripherals, e.g., shunts 40, parallels 50, and intra-bay loops 25, are executed according to SEMI interface standards. Accordingly, while the work piece carriers are operating in the domain of a conveyor line system or element, their movements are controlled entirely by the conveyor controllers 34. However, when a work piece carrier is in the domain of the inter-bay loop 10 or intra-bay loop 25, its movements are controlled by a vehicle control system 32. An exemplary transfer sequence to illustrate control functions follows.

As a vehicle 15 transporting a work piece carrier approaches or appears at an exchange point between the inter-bay loop 10 and an intra-bay loop 25, the vehicle control system 32 notifies the conveyor system controller 34 of its intent to transfer the work piece carrier carrying a known lot at the designated vehicle-to-conveyor exchange point as well as of the destination of that work piece carrier within the domain of the intra-bay loop 25, e.g., a process tool 19.

The conveyor controller 34 subsequently executes the standard protocol sequence, instructing the vehicle 15 to execute the transfer at the designated vehicle-to-conveyor exchange point. At the completion of the transfer sequence, the conveyor line segment transports the work piece carrier to the corresponding intra-bay loop 25 and from the corresponding intra-bay loop 25 to the pre-designated process tool 19 for processing. In the event that the pre-designated process tool 19 is busy, the conveyor controller 34 can, instead, transport the work piece carrier to a dynamic tool buffer 50 for temporary storage until the pre-designated process tool 19 becomes available.

Once processing has been completed, the conveyor controller 34 directs the next available empty vehicle 15 operating on the intra-bay loop 25 to pick up the completed work-in-progress and to transport the work piece carrier to a designated conveyor-to-vehicle exchange point. When the work piece carrier arrives at the designated exchange point, the conveyor controller 34 notifies the vehicle system controller 32 of the availability of the work piece carrier at the designated conveyor-to-vehicle exchange point.

The vehicle system controller 32 can then coordinate for the next available empty vehicle 15 to pick up the work piece carrier at the designated exchange point where the reverse of the above transfer protocol sequence is executed. The work piece can then be transported to the next process tool 19.

Overall operational control of the network 20 is achieved by providing work piece positional data signals for each vehicle 15 and each conveyor line segment to the central controller 30. The central controller 30 compiles these data and, subject to a control algorithm, provides signals to each vehicle 15 and each conveyor line segment for the disposition of each work piece lot. Process tools 19 and/or their I/O ports also provide tool-specific data to the central controller 30, such as whether or not the I/O port of the process tool 19 is occupied or free, processing time, and so forth, which also affects final disposition of work piece lots. In short, by increasing the number of pick up points and destination points on the primary monorail transportation network 10 and by increasing the number of pick up and drop off events occurring within a single circuit of each vehicle on the monorail transportation network, the empty run time and/or idle time between a first pick up and a first drop off event and subsequent pick up and drop off events occurring within a single circuit of the vehicle can be reduced, increasing throughput by optimizing utilization of the vehicles.

Many changes in the details, materials, and arrangement of parts and steps, herein described and illustrated, can be made by those skilled in the art in light of teachings contained hereinabove. Accordingly, it will be understood that the following claims are not to be limited to the embodiments disclosed herein and can include practices other than those specifically described, and are to be interpreted as broadly as allowed under the law.

What is claimed is:

1. A high-efficiency workpiece transportation system for a clean manufacturing environment, comprising:
a rail-based transportation pathway configured as a loop and providing indirect workpiece transportation via discrete vehicles selectively transiting the indirect transportation pathway, each vehicle capable of selectively transporting a workpiece;
a plurality of static transfer points disposed along the indirect transportation pathway, each capable of being a destination for a workpiece transported by one of the discrete vehicles, a source of a workpiece to be transported by one of the discrete vehicles, or both such a destination and source;
a conveyor transportation pathway enabling direct, asynchronous workpiece transportation; and
a plurality of dynamic transfer points disposed along the indirect transportation pathway, each being an interface between the indirect transportation pathway and one end of the direct transportation pathway, wherein each dynamic transfer point enables the transfer of a workpiece from one of the discrete vehicles to the direct transportation pathway and/or the transfer of a workpiece to one of the discrete vehicles from the direct transportation pathway, wherein the plurality of dynamic transfer points and direct transportation pathway enable a workpiece to be selectively off-loaded from or loaded onto one of the discrete vehicles transiting the indirect transportation pathway, thereby enabling increased utilization of a vehicle transiting the indirect transportation pathway per loop cycle compared to utilization of the vehicle in the absence of the plurality of dynamic transfer points and direct transportation pathway, and wherein each of the plurality of dynamic transfer points enables a choice of multiple transiting pathways for a workpiece to reach a destination.

2. The system of claim 1, wherein the discrete vehicles are rail-guided vehicles traveling on or suspended from the rail-based system.

3. The system of claim 1, wherein at least one of the plurality of static transfer points comprises a stocker capable of moving a workpiece to or from one of the discrete vehicles transiting the indirect transportation pathway at the stocker and selectively storing the workpiece in the stocker.

4. The system of claim 3, further comprising one of a further transportation pathway or a process tool in communication with the stocker for selectively exchanging a workpiece to and from the stocker.

5. The system of claim 1, wherein at least one of the plurality of static transfer points comprises a process tool for performing a manufacturing operation on a workpiece, the process tool capable of receiving the workpiece from or providing the workpiece to one of the discrete vehicles transiting the indirect transportation pathway at the process tool.

6. The system of claim 1, wherein each of the plurality of static transfer points is mechanically integrated with the indirect transportation pathway and represents a destination or source of workpieces transported by the discrete vehicles transiting the indirect transportation pathway.

7. The system of claim 1, wherein each of the plurality of dynamic transfer points is below the indirect transportation pathway to enable the transfer of a workpiece from one of the discrete vehicles to the direct transportation pathway and/or the transfer of a workpiece to one of the discrete vehicles from the direct transportation pathway.

8. The system of claim 1, wherein the direct transportation pathway comprises plural, consecutively arranged conveyor segments configured to enable autonomous, collision-free workpiece conveyance, accumulation, and queuing.

9. The system of claim 1, wherein the transportation system is configured such that one of the discrete vehicles transiting the indirect transportation pathway transits, in order, a first dynamic transfer point configured to transfer a workpiece to the vehicle from the direct transportation pathway, a static transfer point configured to transfer a workpiece to or from the vehicle, and a second dynamic transfer point configured to transfer a workpiece from the vehicle to the direct transportation pathway.

10. The system of claim 1, wherein the transportation system is configured such that a first of the discrete vehicles transiting the indirect transportation pathway transits, in order, a first dynamic transfer point configured to transfer a first workpiece from the first discrete vehicle to the direct transportation pathway, a first static transfer point configured to transfer a second workpiece from the first static transfer point to the first discrete vehicle, a second static transfer point configured to transfer the second workpiece from the first discrete vehicle to the second static transfer point, and a second dynamic transfer point configured to transfer the first workpiece from the direct transportation pathway to the first discrete vehicle.

11. A method of improving the usage efficiency of a vehicle operating in conjunction with a rail-based transportation pathway in a clean manufacturing environment, the rail-based transportation pathway configured as a loop and enabling indirect workpiece transportation via discrete vehicles selectively transiting the indirect transportation pathway, each vehicle capable of selectively transporting a workpiece, the indirect transportation pathway having disposed therealong a plurality of static transfer points, each capable of being a destination for a workpiece transported by one of the discrete vehicles, a source of a workpiece to be transported by one of the discrete vehicles, or both such a destination and source, the method comprising:

providing a conveyor transportation pathway, enabling direct, asynchronous, autonomous and collision-free workpiece conveyance, accumulation, and queuing;

disposing a plurality of dynamic transfer points along the indirect transportation pathway, each being an interface between the indirect transportation pathway and one end of the direct transportation pathway, each dynamic transfer point enabling the selective transfer of a workpiece between one of the discrete vehicles transiting the indirect transportation pathway and the direct transportation pathway and enabling a choice of multiple transiting pathways for a workpiece to reach a destination; and selectively transferring a workpiece from one of the discrete vehicles transiting the indirect transportation pathway to the direct transportation pathway at a first of the dynamic transfer points at a first location along the indirect transportation pathway and selectively transferring a workpiece to one of the discrete vehicles transiting the indirect transportation pathway from the direct transportation pathway at a second of the dynamic transfer points at a second location along the indirect transportation pathway, thereby enabling increased utilization of a vehicle transiting the indirect transportation pathway per loop cycle compared to utilization of the vehicle in the absence of the direct transportation pathway and plurality of dynamic transfer points.

12. The method of claim 11, wherein at least one of the static transfer points is provided as a stocker, and wherein the method further comprises selectively transferring a workpiece between one of the discrete vehicles and one of the static transfer points provided as a stocker.

13. The method of claim 12, further comprising transferring the workpiece between the stocker and a further transportation pathway or process tool in communication therewith.

14. The method of claim 11, wherein the step of selectively transferring further comprises receiving the workpiece on the direct transportation pathway and autonomously and asynchronously transferring the workpiece from a first end of the direct transportation pathway to a second end of the direct transportation pathway and buffering the workpiece until an empty one of the discrete vehicles arrives at the respective dynamic transfer point, whereupon the workpiece is transferred from the direct transportation pathway to the vehicle.

15. The method of claim 11, further comprising the sequential steps of:

transiting a first of the discrete vehicles on the indirect transportation pathway past a first dynamic transfer point configured to selectively transfer a workpiece from the direct transportation pathway to one of the vehicles on the indirect transportation pathway;

transiting the first discrete vehicle on the indirect transportation pathway past a static transfer point configured to selectively transfer a workpiece to or from the first discrete vehicle; and transiting the first discrete vehicle on the indirect transportation pathway past a second dynamic transfer point configured to selectively transfer a workpiece to the direct transportation pathway from one of the vehicles on the indirect transportation pathway.

16. The method of claim 11, further comprising the sequential steps of:

transiting a first of the discrete vehicles on the indirect transportation pathway to a first dynamic transfer point and transferring a first workpiece from the first discrete vehicle to the direct transportation pathway;

transiting the first discrete vehicle on the indirect transportation pathway to a first static transfer point and transferring a second workpiece from the first static transfer point to the first discrete vehicle;

transiting the first discrete vehicle on the indirect transportation pathway to a second static transfer point and transferring the second workpiece from the first discrete vehicle to the second static transfer point; and transiting the first discrete vehicle on the indirect transportation pathway to a second dynamic transfer point and transferring the first workpiece from the indirect transportation pathway to the first discrete vehicle.

* * * * *